(12) United States Patent
Ambo et al.

(10) Patent No.: US 10,897,183 B2
(45) Date of Patent: Jan. 19, 2021

(54) ON-VEHICLE MOTOR-DRIVEN COMPRESSOR

(71) Applicant: KABUSHIKI KAISHA TOYOTA JIDOSHOKKI, Kariya (JP)

(72) Inventors: Shunsuke Ambo, Kariya (JP); Fumihiro Kagawa, Kariya (JP); Hiroshi Fukasaku, Kariya (JP); Yoshiki Nagata, Kariya (JP); Junya Kaida, Kariya (JP); Takashi Kawashima, Kariya (JP); Yoshikazu Hayashi, Kariya (JP); Hidehiro Kudo, Kariya (JP); Takahiro Okazaki, Kariya (JP); Takashi Yoshida, Kariya (JP)

(73) Assignee: KABUSHIKI KAISHA TOYOTA JIDOSHOKKI, Kariya (JP)

( * ) Notice: Subject to any disclaimer, the term of this patent is extended or adjusted under 35 U.S.C. 154(b) by 2 days.

(21) Appl. No.: 16/366,262

(22) Filed: Mar. 27, 2019

(65) Prior Publication Data

US 2019/0305648 A1 Oct. 3, 2019

(30) Foreign Application Priority Data

Mar. 30, 2018 (JP) .................................. 2018-070062
Dec. 27, 2018 (JP) .................................. 2018-245850

(51) Int. Cl.
*H02K 11/02* (2016.01)
*B60H 1/32* (2006.01)
(Continued)

(52) U.S. Cl.
CPC .......... *H02K 11/02* (2013.01); *B60H 1/3222* (2013.01); *H02K 11/33* (2016.01); *H03H 7/0115* (2013.01)

(58) Field of Classification Search
CPC ............. H02K 11/30; H02K 5/10; H02K 7/08
(Continued)

(56) References Cited

U.S. PATENT DOCUMENTS 5,546,065 A * 8/1996 Vinciarelli ............ H01F 27/346
336/212
6,246,311 B1 * 6/2001 Finnemore ............ H01F 17/062
336/192
(Continued)

FOREIGN PATENT DOCUMENTS

CN 106341069 A 1/2017
JP 03286511 A 12/1991
(Continued)

*Primary Examiner* — Jose A Gonzalez Quinones
(74) *Attorney, Agent, or Firm* — Sughrue Mion, PLLC

(57) ABSTRACT

An on-vehicle motor-driven compressor includes a compression unit, an electric motor, and an inverter device. The inverter device includes an inverter circuit and a noise reducer. The noise reducer includes a common-mode choke coil and a smoothing capacitor. The common-mode choke coil includes a loop-shaped core, a first winding wound around the core, a second winding wound around the core, the second winding being spaced apart from and opposed to the first winding, and a loop-shaped conductor that covers the core while extending over the first winding and the second winding. The core includes an exposed portion that is not covered with the conductor. Parts of the conductor that are opposed to each other between the first winding and the second winding are spaced apart from each other.

9 Claims, 12 Drawing Sheets

(51) Int. Cl.
*H02K 11/33* (2016.01)
*H03H 7/01* (2006.01)

(58) Field of Classification Search
USPC .............................. 310/75 R, 71, 49.13, 68 D
See application file for complete search history.

(56) References Cited

U.S. PATENT DOCUMENTS

2017/0012506 A1    1/2017  Naito et al.
2017/0288512 A1*  10/2017  Kagawa ................. H02K 11/33

FOREIGN PATENT DOCUMENTS

| JP | 0766041 A | 3/1995 |
| KR | 10-2005-0056560 A | 6/2005 |
| WO | 2017/170817 A1 | 10/2017 |

* cited by examiner

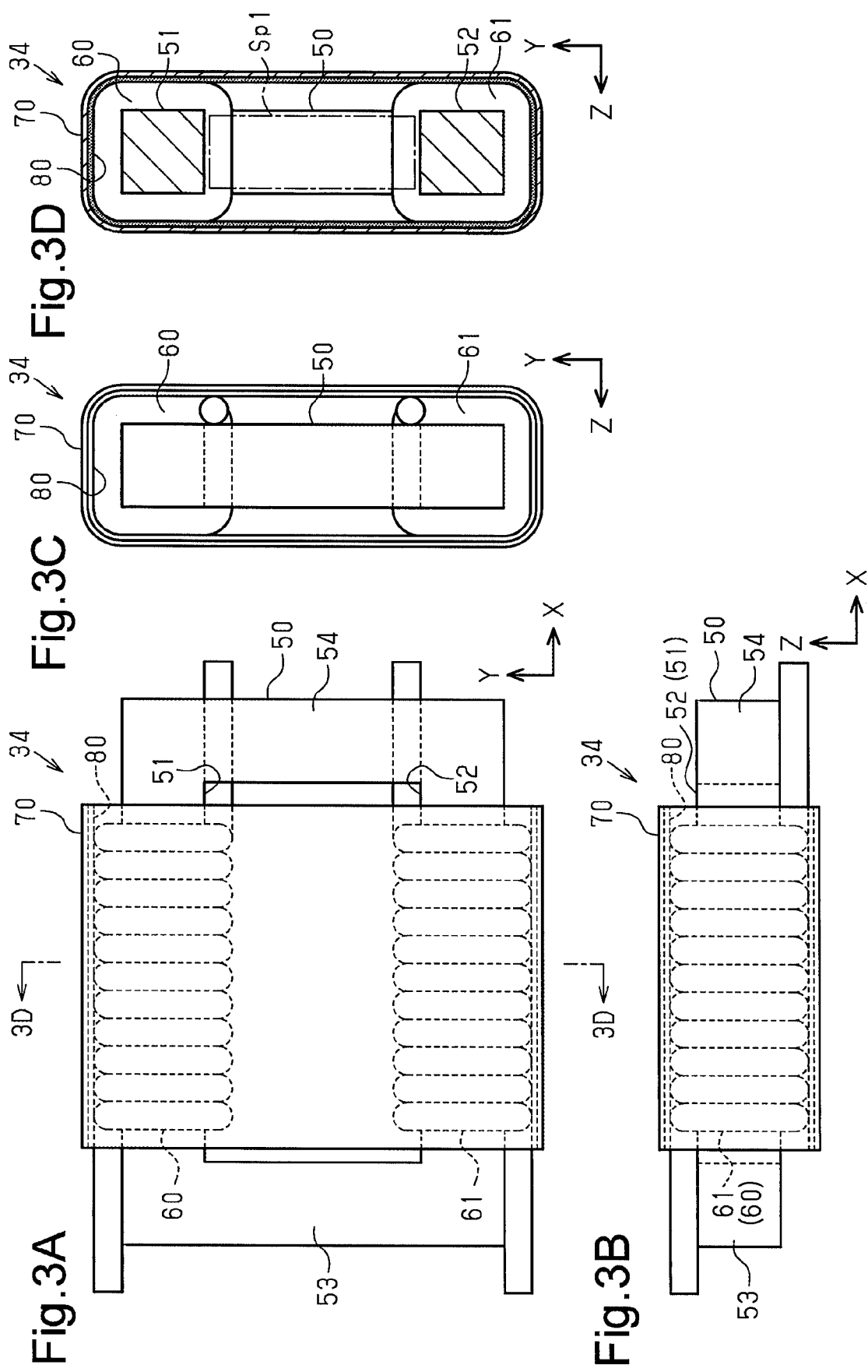

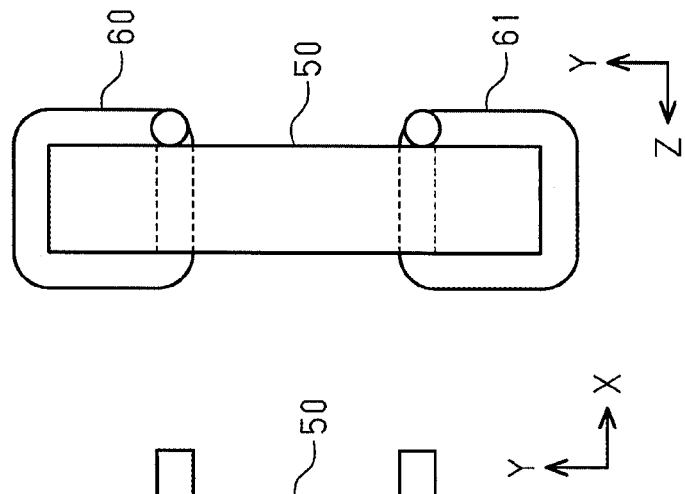
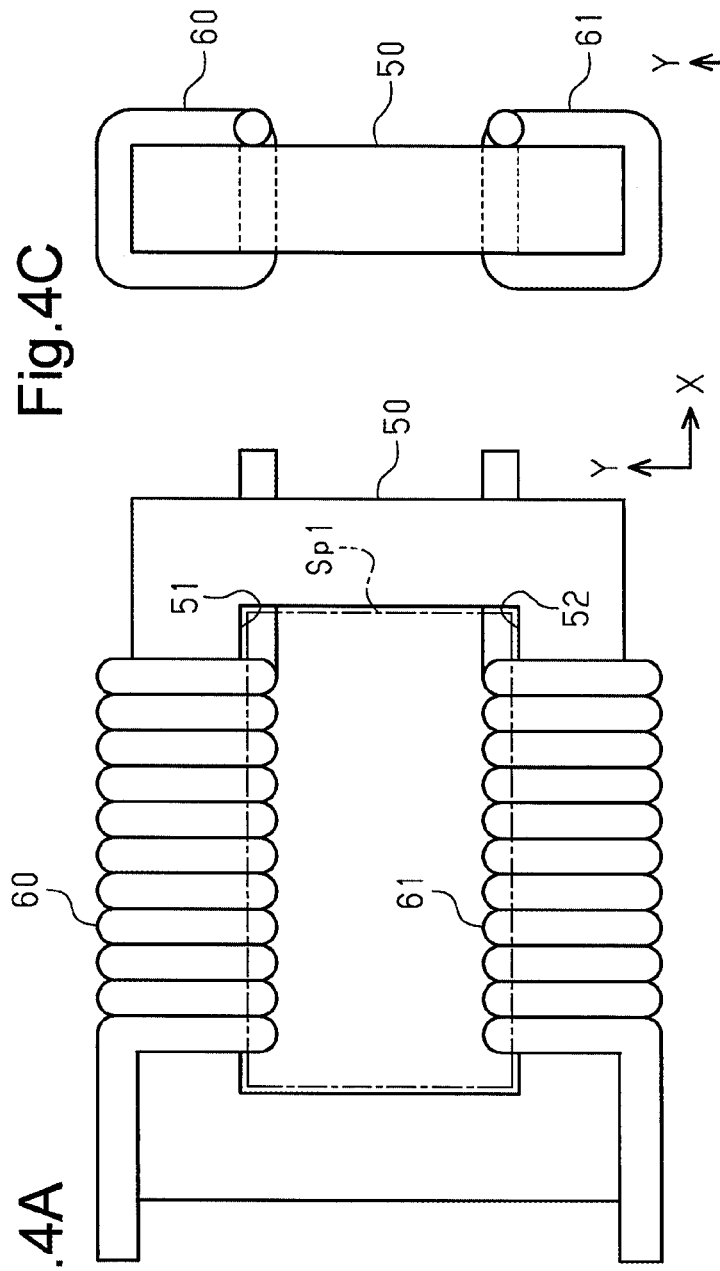
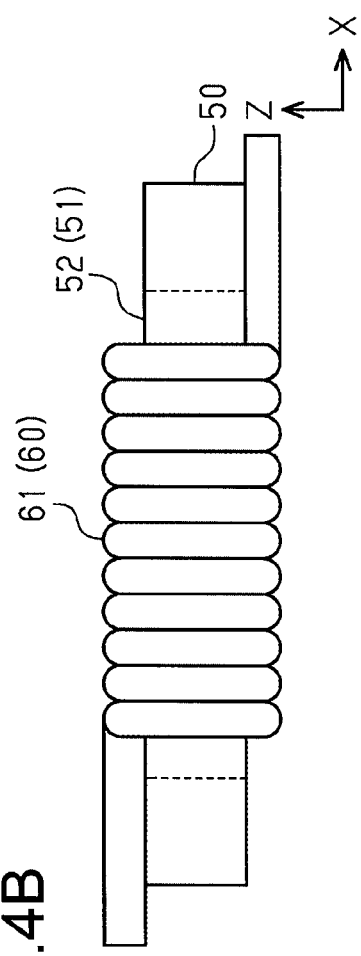

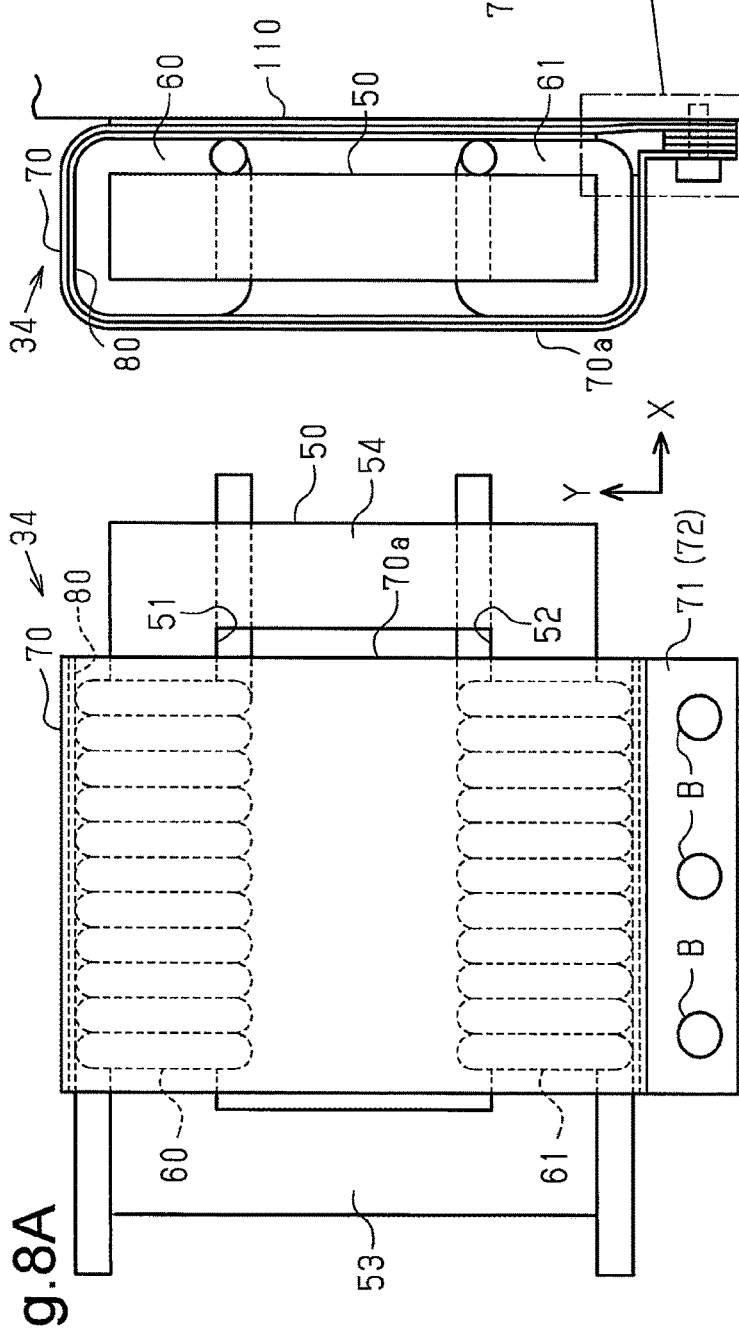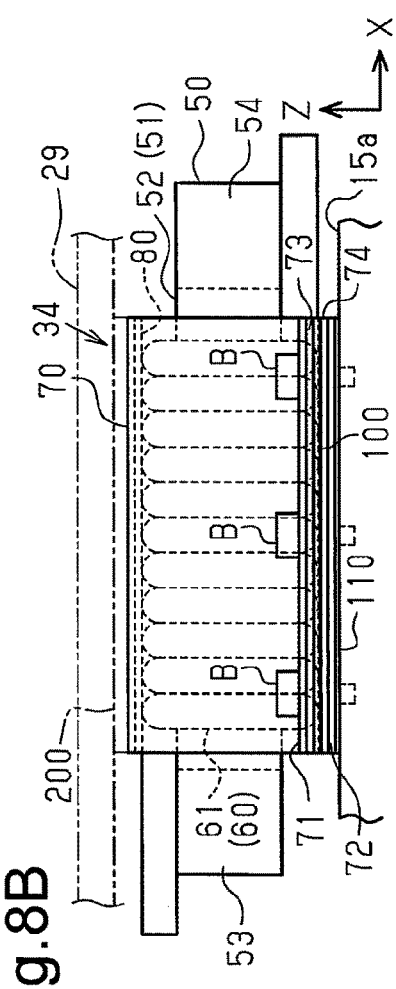

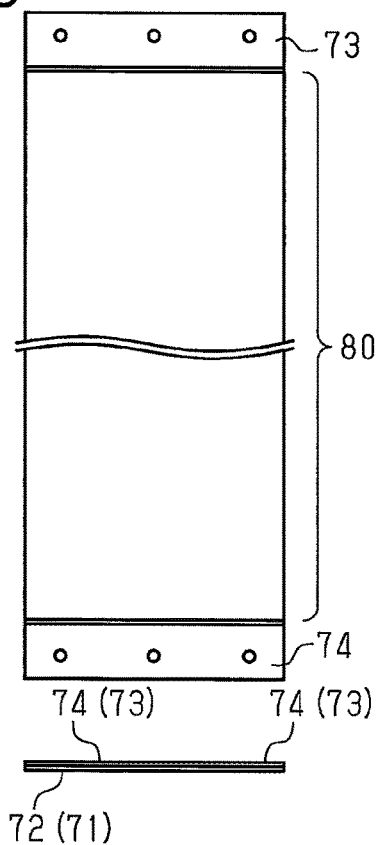
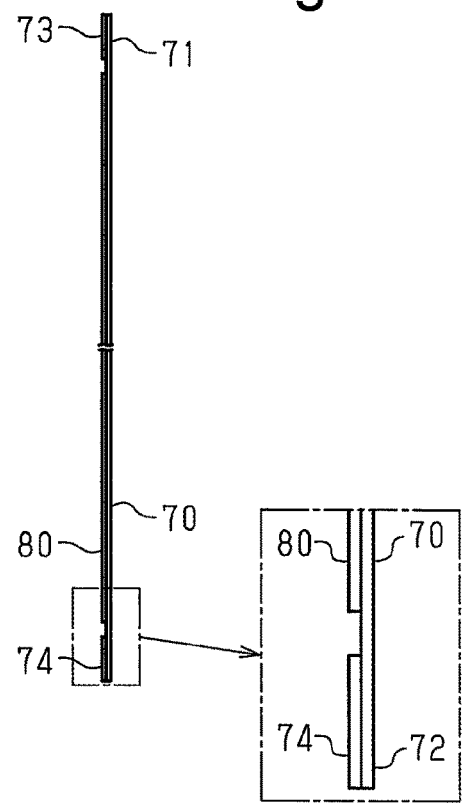
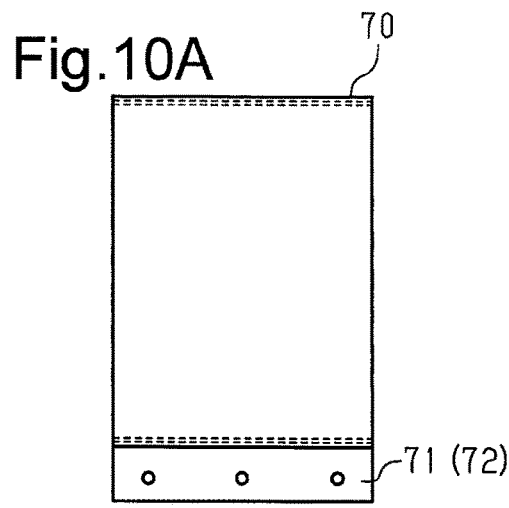
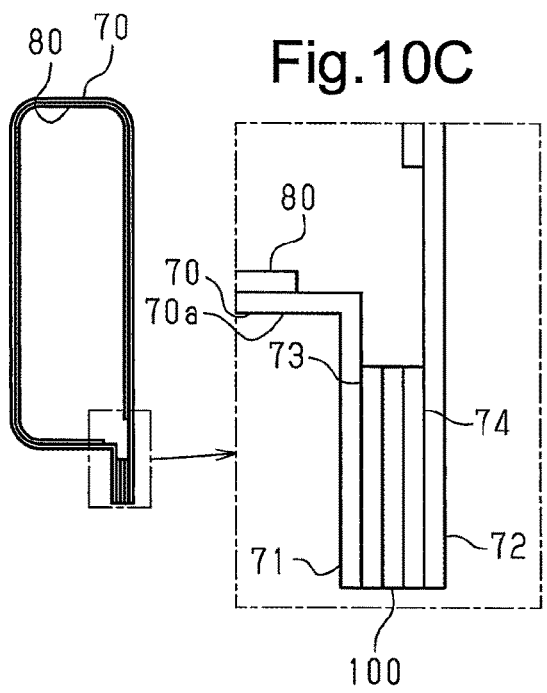
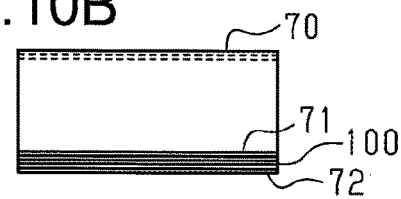

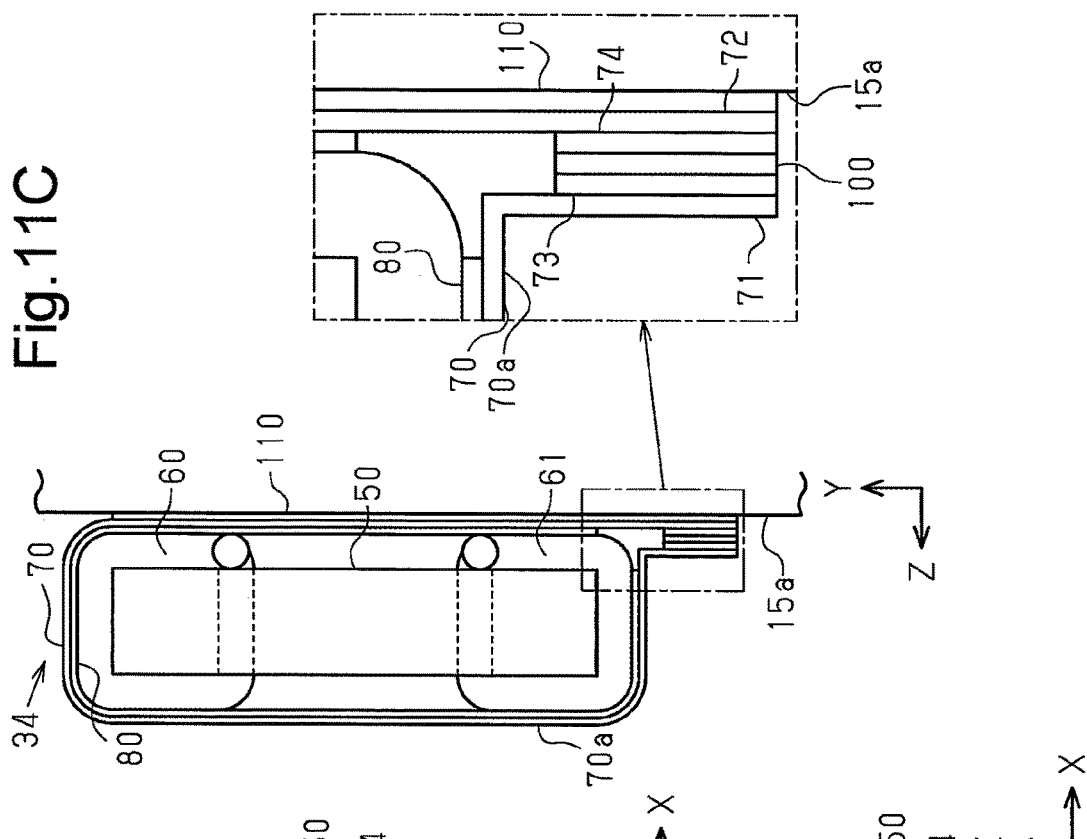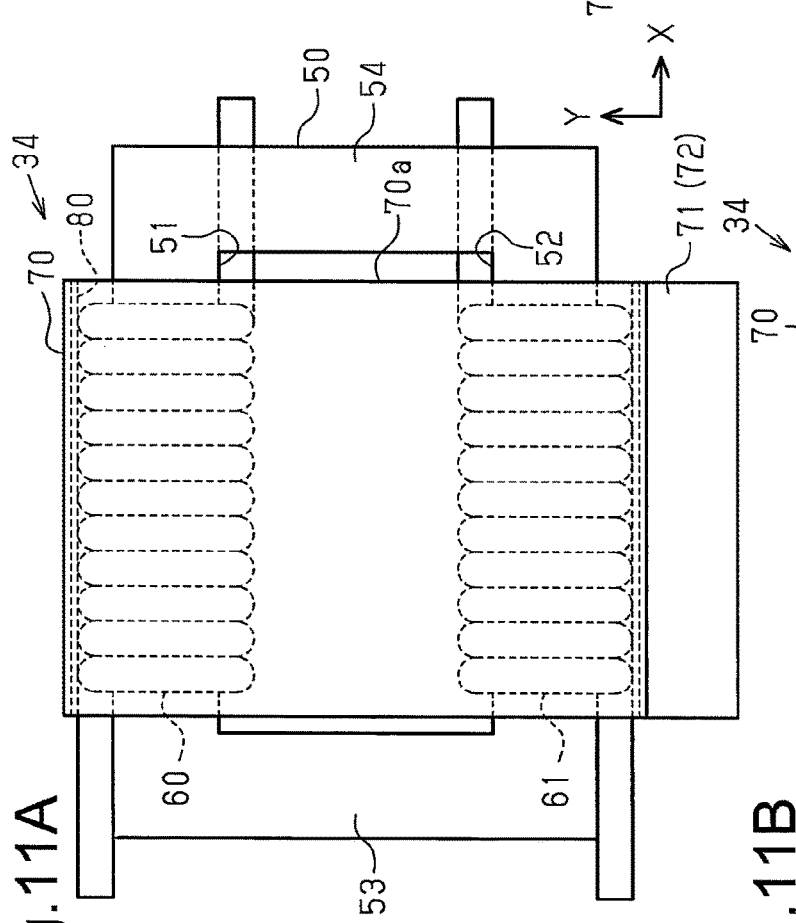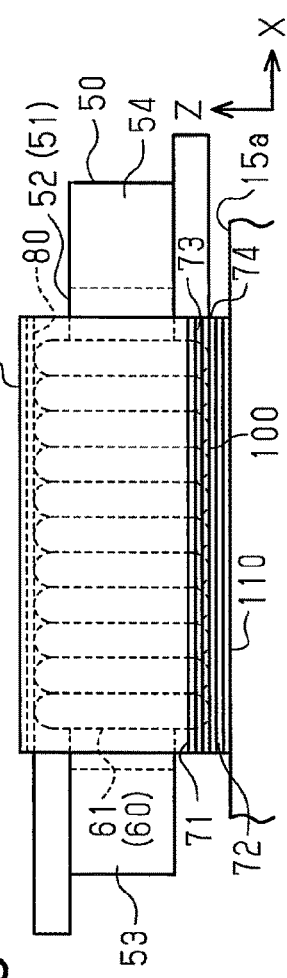

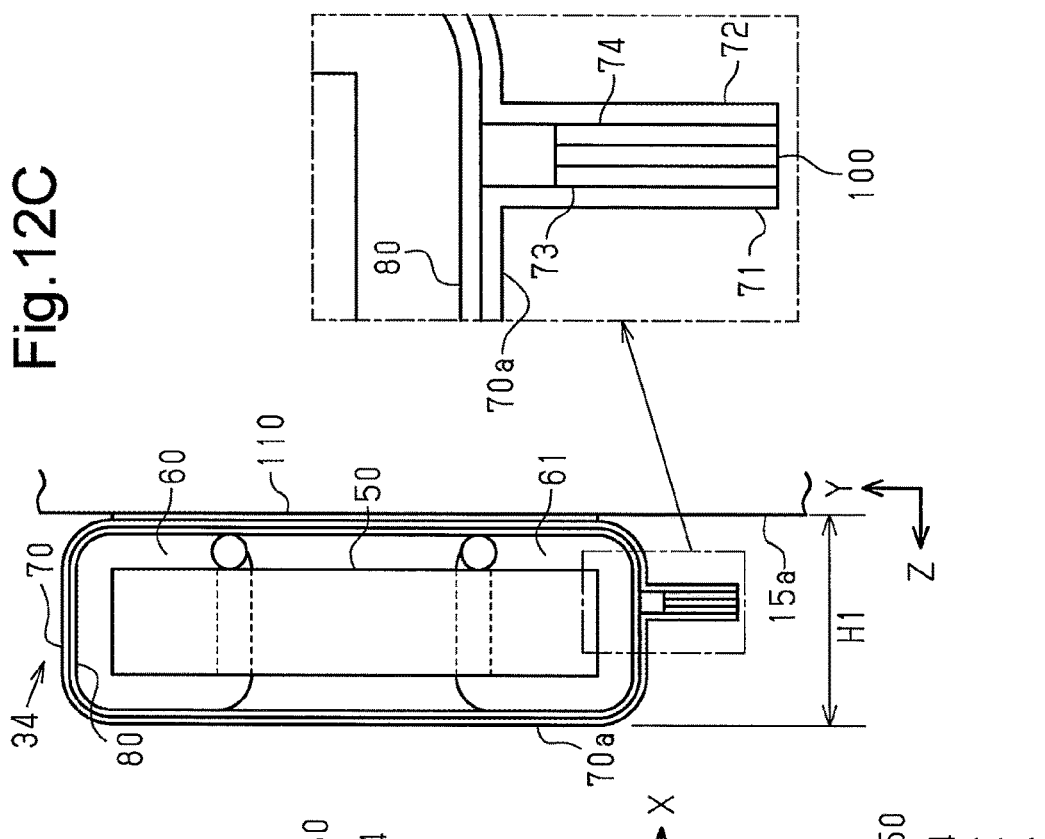
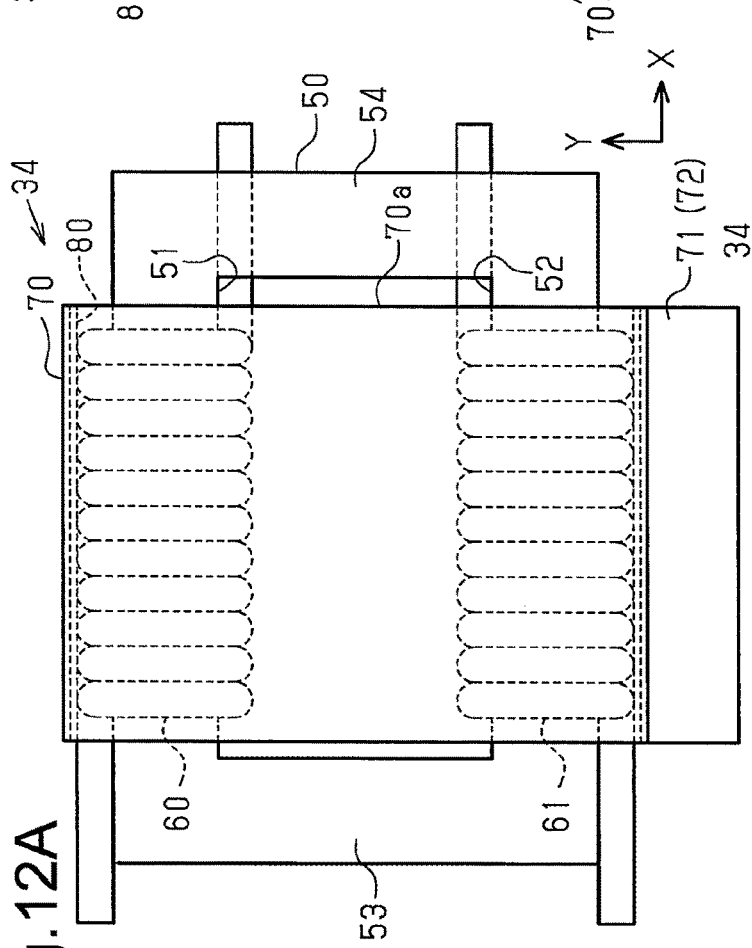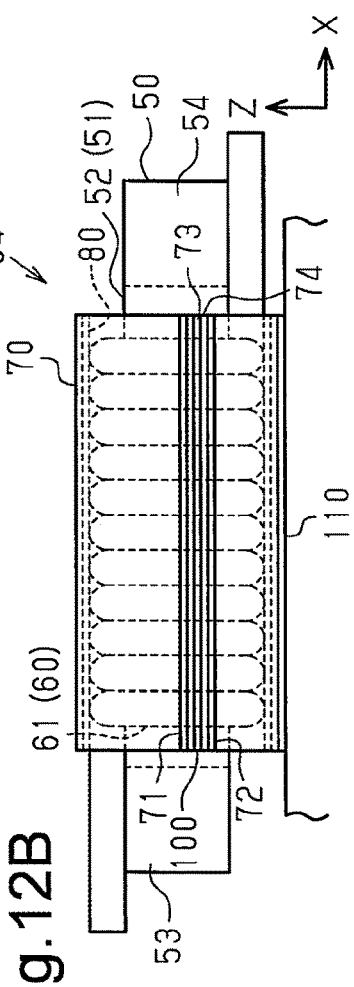

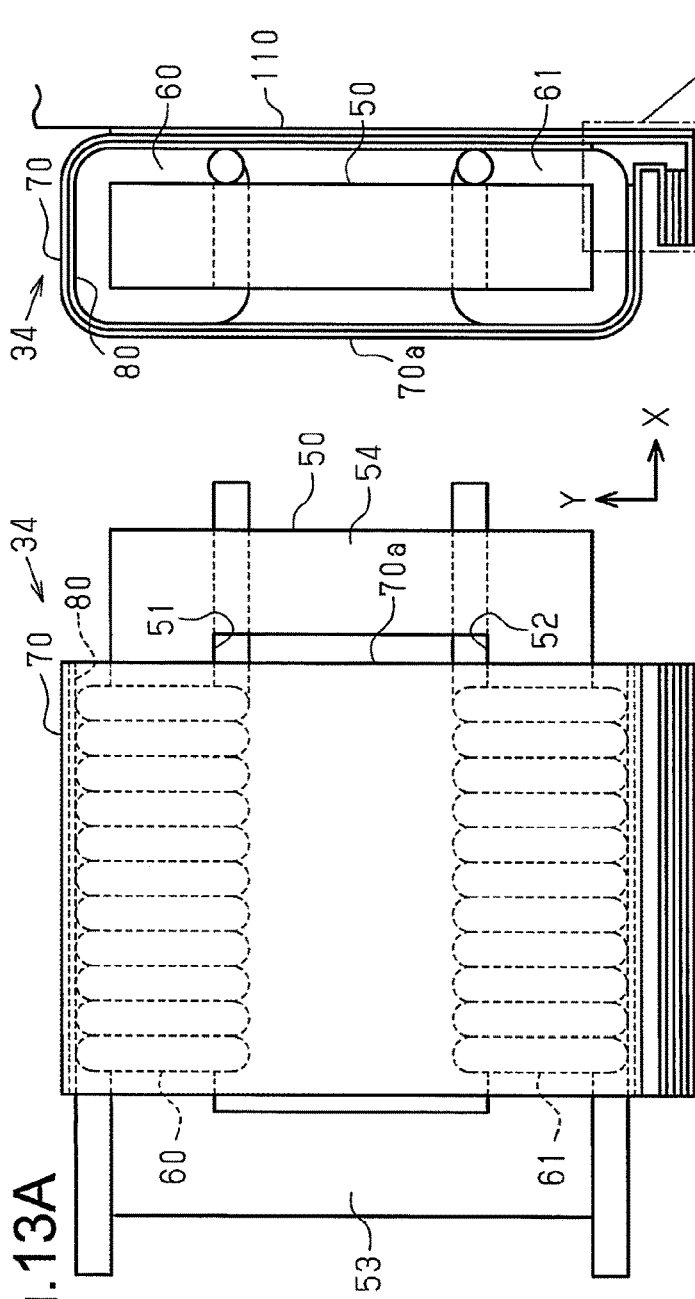
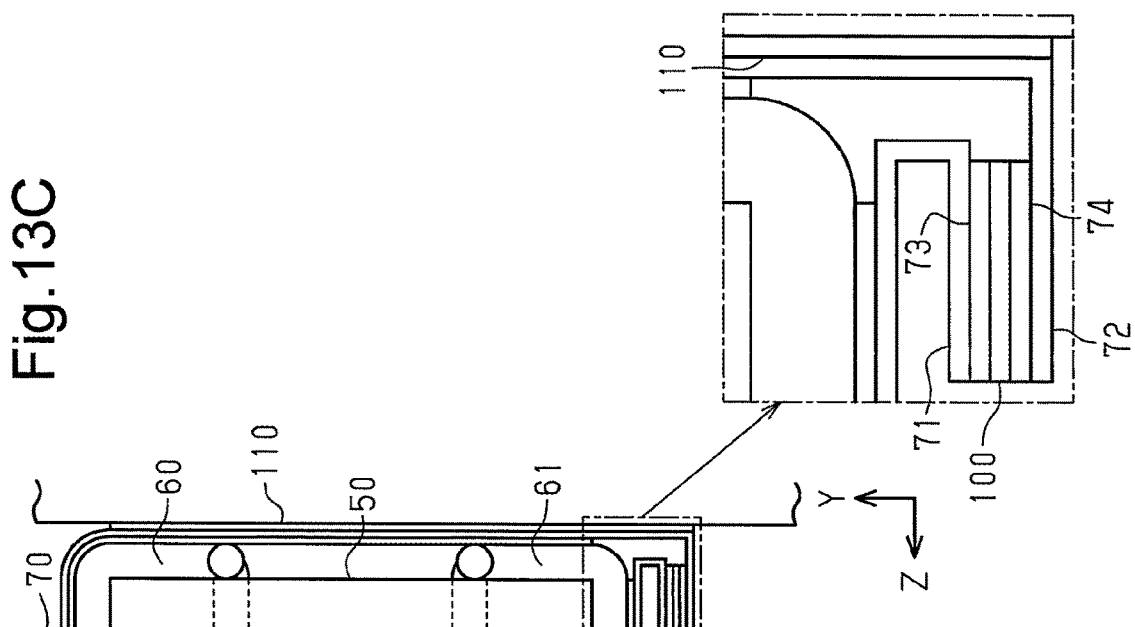
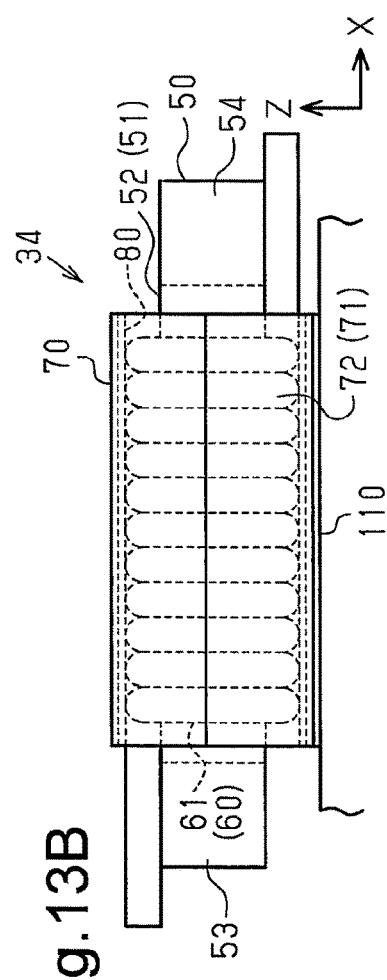

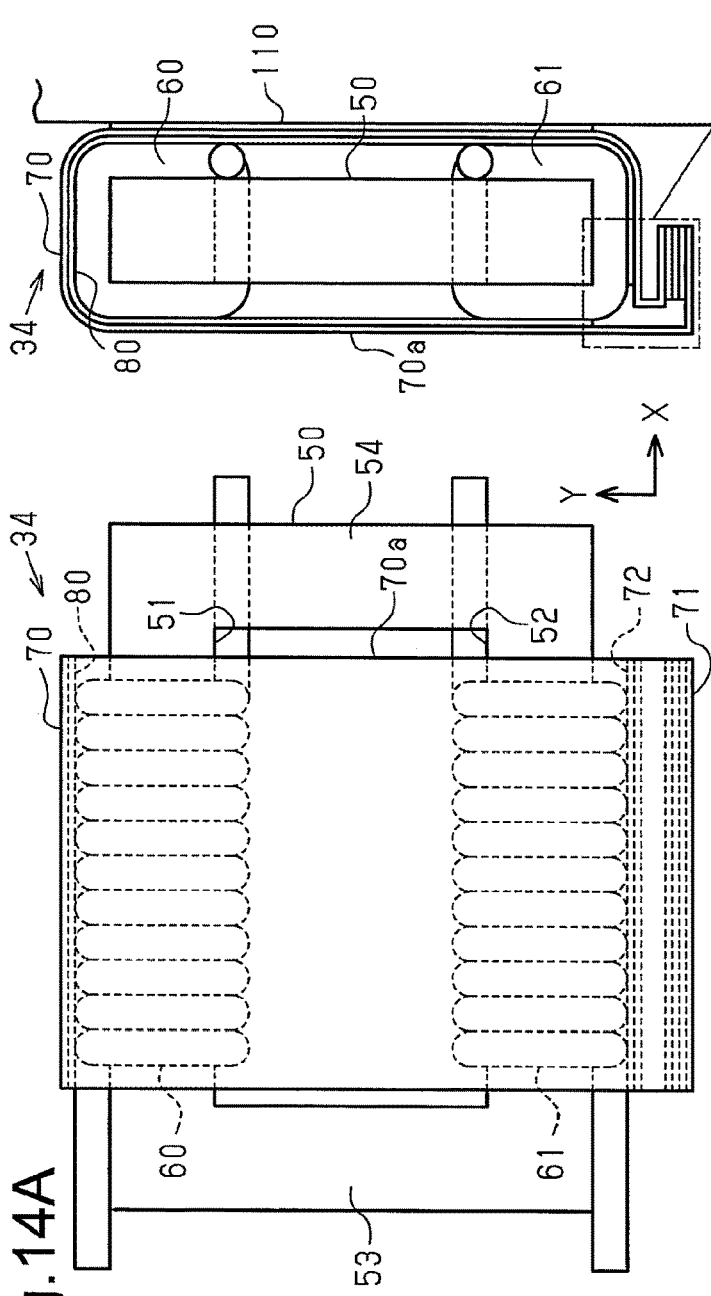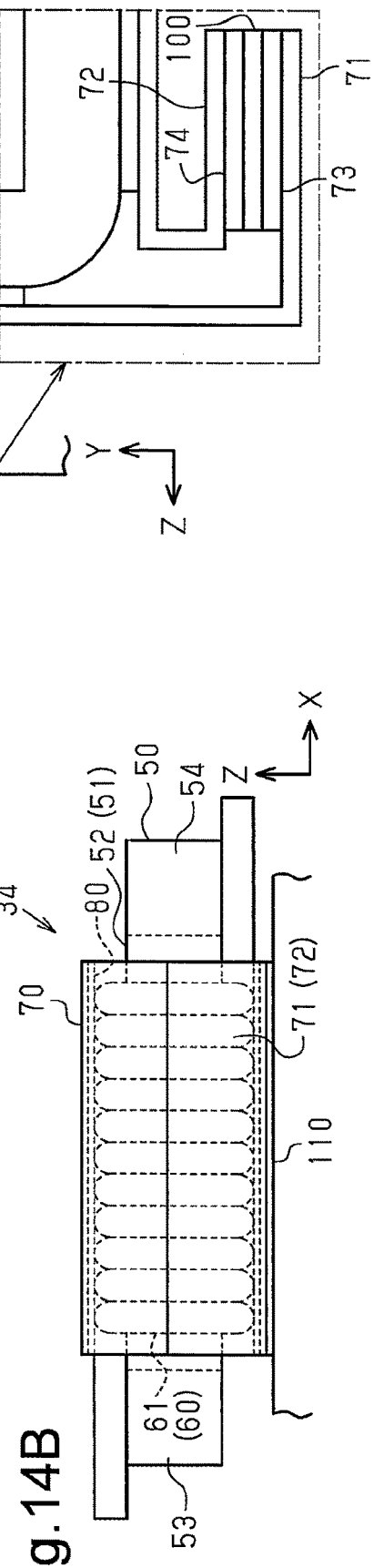

ON-VEHICLE MOTOR-DRIVEN COMPRESSOR

BACKGROUND

The present disclosure relates to an on-vehicle motor-driven compressor.

International Patent Publication WO2017/170817 discloses one example of the configuration of a common-mode choke coil used for an inverter device that drives an electric motor in an on-vehicle motor-driven compressor. The choke coil of the publication is covered with an electrical conductor so as to achieve a damping effect by which a normal-mode current flowing in the conductor causes an induced current to flow in the conductor that is then converted into thermal energy.

When entirely covered with the conductor, the choke coil may tend to be filled with heat and become difficult to manufacture. When a portion that is not covered with the conductor is arranged in order to improve the heat dissipation properties, the flow of an induced current may be limited, thereby lowering the damping effect.

SUMMARY

It is an object of the present disclosure to provide an on-vehicle motor-driven compressor including a filter circuit excellent in the heat dissipation properties and damping effect.

An on-vehicle motor-driven compressor according to one aspect includes a compression unit configured to compress fluid, an electric motor configured to drive the compression unit, and an inverter device configured to drive the electric motor. The inverter device includes an inverter circuit configured to convert direct-current power into alternating-current power and a noise reducer arranged on an input side of the inverter circuit. The noise reducer is configured to reduce common-mode noise and normal-mode noise contained in the direct-current power before being input to the inverter circuit. The noise reducer includes a common-mode choke coil and a smoothing capacitor. The common-mode choke coil and the smoothing capacitor configure a low-pass filter circuit. The common-mode choke coil includes a loop-shaped core, a first winding wound around the core, a second winding wound around the core, the second winding being spaced apart from and opposed to the first winding, and a loop-shaped conductor that covers the core while extending over the first winding and the second winding. The core includes an exposed portion that is not covered with the conductor. Parts of the conductor that are opposed to each other between the first winding and the second winding are spaced apart from each other.

Other aspects and advantages of the present disclosure will become apparent from the following description, taken in conjunction with the accompanying drawings, illustrating by way of example the principles of the disclosure.

BRIEF DESCRIPTION OF THE DRAWINGS

The disclosure may be understood by reference to the following description together with the accompanying drawings in which:

FIG. 3A is a plan view of a common-mode choke coil in a first embodiment;

FIG. 3B is a front view of the common-mode choke coil shown in FIG. 3A;

FIG. 3C is a right side view of the common-mode choke coil shown in FIG. 3A;

FIG. 3D is a cross-sectional view taken along line 3D-3D in FIG. 3A;

FIG. 4A is a plan view showing a core and windings;

FIG. 4B is a front view showing the core and the windings;

FIG. 4C is a right side view showing the core and the windings;

FIG. 8A is a plan view of a common-mode choke coil in a second embodiment;

FIG. 8B is a front view of the common-mode choke coil shown in FIG. 8A;

FIG. 8C is a right side view of the common-mode choke coil shown in FIG. 8A;

FIG. 9A is a plan view illustrating a method for manufacturing a metal thin film;

FIG. 9B is a front view illustrating the method for manufacturing the metal thin film;

FIG. 9C is a right side view illustrating the method for manufacturing the metal thin film;

FIG. 10A is a plan view illustrating the method for manufacturing the metal thin film;

FIG. 10B is a front view illustrating the method for manufacturing the metal thin film;

FIG. 10C is a right side view illustrating the method for manufacturing the metal thin film;

FIG. 11A is a plan view of a common-mode choke coil in a modification;

FIG. 11B is a front view of the common-mode choke coil shown in FIG. 11A;

FIG. 11C is a right side view of the common-mode choke coil shown in FIG. 11A;

FIG. 12A is a plan view of a common-mode choke coil in another modification;

FIG. 12B is a front view of the common-mode choke coil shown in FIG. 12A;

FIG. 12C is a right side view of the common-mode choke coil shown in FIG. 12A;

FIG. 13A is a plan view of a common-mode choke coil in a further modification;

FIG. 13B is a front view of the common-mode choke coil shown in FIG. 13A;

FIG. 13C is a right side view of the common-mode choke coil shown in FIG. 13A;

FIG. 14A is a plan view of a common-mode choke coil in still another modification;

FIG. 14B is a front view of the common-mode choke coil shown in FIG. 14A; and

FIG. 14C is a right side view of the common-mode choke coil shown in FIG. 14A.

DETAILED DESCRIPTION

First Embodiment

An embodiment will now be described with reference to the drawings. An on-vehicle motor-driven compressor 11 of the first embodiment includes a compression unit 18 that compresses refrigerant serving as fluid and is used with, for example, an on-vehicle vehicle air conditioner. That is, the fluid to be compressed in the on-vehicle motor-driven compressor in the first embodiment is refrigerant.

Figure 1:
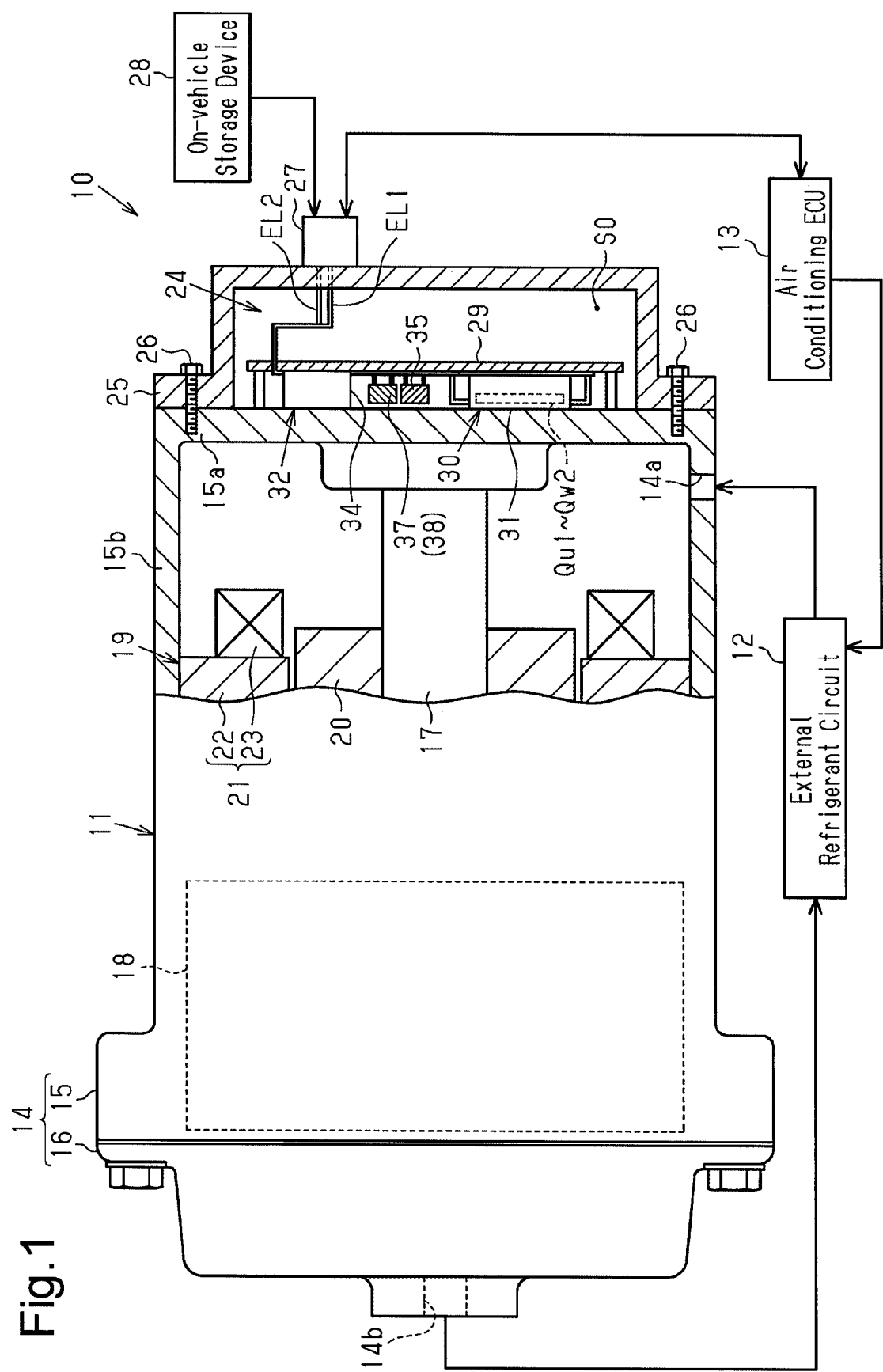
FIG. 1 is a schematic view showing an on-vehicle motor-driven compressor.

As shown in FIG. 1, an on-vehicle air conditioner 10 includes the on-vehicle motor-driven compressor 11 and an external refrigerant circuit 12 that supplies the on-vehicle motor-driven compressor 11 with refrigerant serving as fluid. The external refrigerant circuit 12 includes, for example, a heat exchanger and an expansion valve. The on-vehicle motor-driven compressor 11 compresses refrigerant and the external refrigerant circuit 12 performs heat exchange of the refrigerant and expands the refrigerant. This allows the on-vehicle air conditioner 10 to cool and warm the passenger compartment.

The on-vehicle air conditioner 10 includes an air conditioning ECU 13 that controls the entire on-vehicle air conditioner 10. The air conditioning ECU 13 is configured to obtain, for example, the temperature of the passenger compartment and the preset temperature of the car air conditioner. Based on the parameters, the air conditioning ECU 13 transmits various commands such as an on-off command to the on-vehicle motor-driven compressor 11.

The on-vehicle motor-driven compressor 11 includes a housing 14 having an intake port 14*a* into which refrigerant is drawn in from the external refrigerant circuit 12.

The housing 14 is made of a thermally conductive material (for example, metal such as aluminum). The housing 14 is grounded to the vehicle body.

The housing 14 includes an intake housing member 15 and a discharge housing member 16 that are coupled to each other. The intake housing member 15 has a tubular shape with one end closed and the other end open. The intake housing member 15 includes a plate-shaped bottom wall 15*a* and a side wall 15*b* that extends from the edge of the bottom wall 15*a* toward the discharge housing member 16. The bottom wall 15*a* is, for example, substantially plate-shaped, and the side wall 15*b* is, for example, substantially tubular. The discharge housing member 16 is coupled to the intake housing member 15 to close the opening of the intake housing member 15. This defines an internal space in the housing 14.

The intake port 14*a* extends through the side wall 15*b* of the intake housing member 15. More specifically, the intake port 14*a* is located at a position in the side wall 15*b* of the intake housing member 15 closer to the bottom wall 15*a* than to the discharge housing member 16.

The housing 14 has a discharge port 14*b* out of which refrigerant is discharged. The discharge port 14*b* is located at the discharge housing member 16, more specifically, at a part of the discharge housing member 16 opposed to the bottom wall 15*a*.

The on-vehicle motor-driven compressor 11 includes a rotating shaft 17, the compression unit 18, and an electric motor 19 that are accommodated in the housing 14.

The rotating shaft 17 is rotationally supported by the housing 14. The rotating shaft 17 is arranged with its axial direction coinciding with the thickness direction of the plate-shaped bottom wall 15*a* (i.e., the axial direction of the tubular side wall 15*b*). The rotating shaft 17 and the compression unit 18 are coupled to each other.

The compression unit 18 is located in the housing 14 at a position closer to the discharge port 14*b* than to the intake port 14*a* (i.e., the bottom wall 15*a*). Rotation of the rotating shaft 17 causes the compression unit 18 to compress refrigerant that has been drawn into the housing 14 from the intake port 14*a* and then discharge the compressed refrigerant out of the discharge port 14*b*. The specific structure of the compression unit 18 may be of any type such as a scroll type, a piston type, or a vane type.

The electric motor 19 is located in the housing 14 between the compression unit 18 and the bottom wall 15*a*. The electric motor 19 is configured to drive the compression unit 18 by rotating the rotating shaft 17, which is located in the housing 14. The electric motor 19 includes, for example, a cylindrical rotor 20 fixed to the rotating shaft 17 and a stator 21 fixed to the housing 14. The stator 21 includes a cylindrical stator core 22 and coils 23 wound around the teeth of the stator core 22. The rotor 20 and the stator 21 face each other in the radial direction of the rotating shaft 17. When the coils 23 are energized, the rotor 20 and the rotating shaft 17 rotate. This causes the compression unit 18 to compress refrigerant.

As shown in FIG. 1, the on-vehicle motor-driven compressor 11 includes a driver device 24 configured to drive the electric motor 19 and receive direct-current power and a cover 25 that defines an accommodation chamber S0 for accommodating the driver device 24.

The cover 25 is made of a non-magnetic material that is thermally and electrically conductive (for example, metal such as aluminum).

The cover 25 has a tubular shape with one end closed and the other end open toward the housing 14, more specifically, toward the bottom wall 15*a* of the intake housing member 15. The cover 25 is coupled to the bottom wall 15*a* of the housing 14 by bolts 26 with the open end in abutment with the bottom wall 15*a*. The opening of the cover 25 is closed by the bottom wall 15*a*. The accommodation chamber S0 is defined by the cover 25 and the bottom wall 15*a*.

The accommodation chamber S0 is located outside the housing 14 and located on the opposite side of the bottom wall 15*a* from the electric motor 19. The compression unit 18, the electric motor 19, and the driver device 24 are arranged in the axial direction of the rotating shaft 17.

The cover 25 includes a connector 27 to which the driver device 24 is electrically connected. The connector 27 allows the driver device 24 to receive direct-current power from an on-vehicle power storage device 28, which is installed in the vehicle, and electrically connects the air conditioning ECU 13 and the driver device 24 to each other. The on-vehicle power storage device 28 is a direct-current power source installed in the vehicle and is, for example, a rechargeable battery or a capacitor.

As shown in FIG. 1, the driver device 24 includes a circuit board 29, an inverter device 30 provided on the circuit board 29, and two connection lines EL1 and EL2 used to electrically connect the connector 27 and the inverter device 30 to each other.

The circuit board 29 has a plate shape. The circuit board 29 is opposed to the bottom wall 15*a* and spaced apart from the bottom wall 15*a* by a predetermined distance in the axial direction of the rotating shaft 17.

The inverter device 30 is configured to drive the electric motor 19. The inverter device 30 includes an inverter circuit 31 (refer to FIG. 2) and a noise reducer 32 (refer to FIG. 2). The inverter circuit 31 is configured to convert direct-current power into alternating-current power. The noise reducer 32 is located on the input side of the inverter circuit 31 and is configured to reduce common-mode noise and normal-mode noise contained in the direct-current power before being input to the inverter circuit 31.

The electrical configuration of the electric motor 19 and the driver device 24 will now be described.

Figure 2:
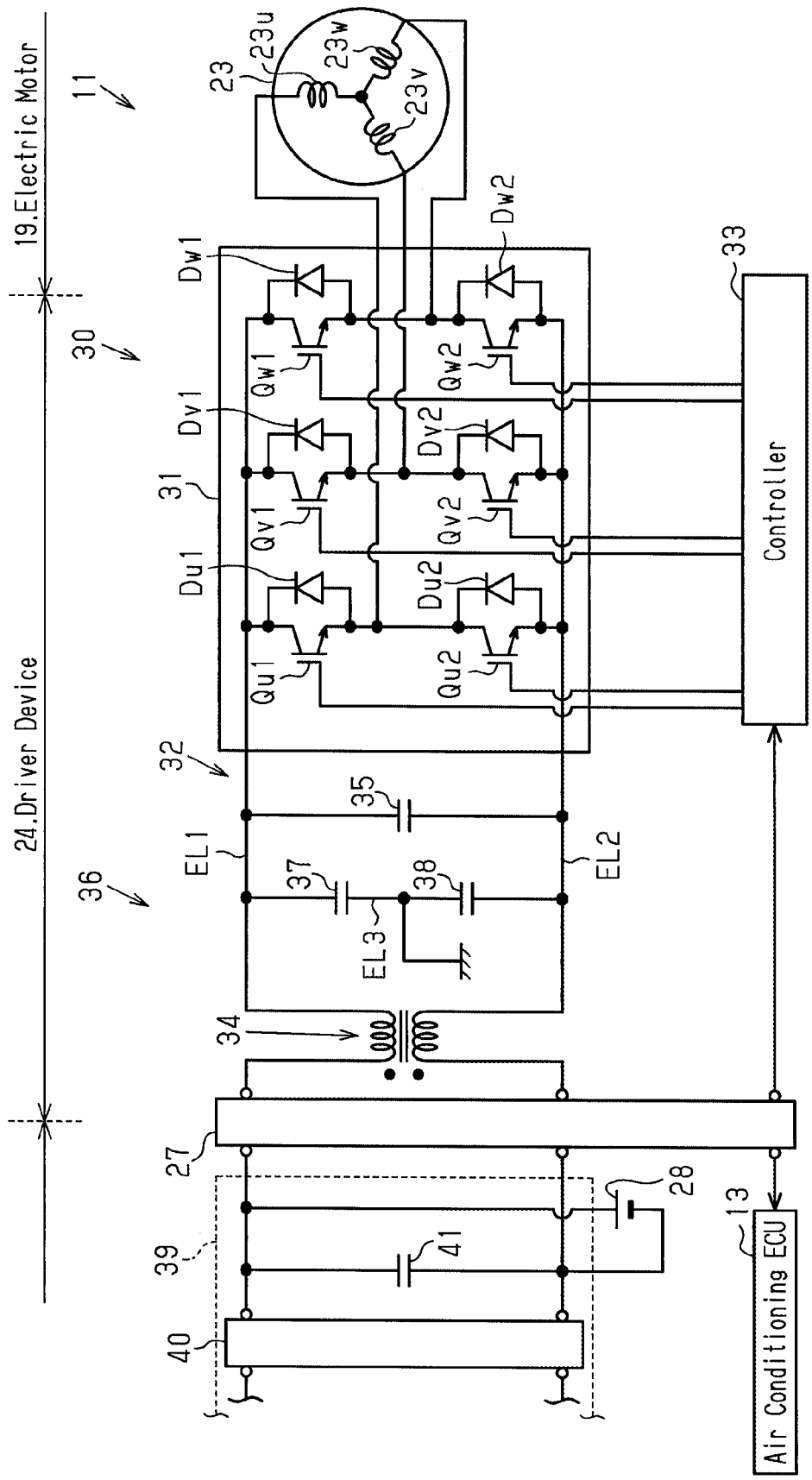
FIG. 2 is a circuit diagram showing a driver device and an electric motor.

As shown in FIG. 2, the coils 23 of the electric motor 19 are of a three-phase structure with, for example, a u-phase coil 23u, a v-phase coil 23v, and a w-phase coil 23w. The coils 23u to 23w are connected in a Y-connection.

The inverter circuit 31 includes u-phase switching elements Qu1 and Qu2 corresponding to the u-phase coil 23u, v-phase switching elements Qv1 and Qv2 corresponding to the v-phase coil 23v, and w-phase switching elements Qw1 and Qw2 corresponding to the w-phase coil 23w. Each of the switching elements Qu1 to Qw2 is, for example, a power switching element such as an insulated gate bipolar transistor (IGBT). The switching elements Qu1 to Qw2 are respectively connected to flyback diodes Du1 to Dw2 (body diodes).

The u-phase switching elements Qu1 and Qu2 are connected in series by a connection wire that is connected to the u-phase coil 23u. The serial connector formed by the u-phase switching elements Qu1 and Qu2 is electrically connected to the two connection lines EL1 and EL2 and receives direct-current power from the on-vehicle power storage device 28.

Although the corresponding coils are different, the remaining power switching elements Qv1, Qv2, Qw1, and Qw2 are connected in the same manner as the u-phase power switching elements Qu1 and Qu2.

The driver device 24 includes a controller 33 that controls the switching operation of the switching elements Qu1 to Qw2. The controller 33 is implemented by, for example, at least one dedicated hardware circuit and/or at least one processor (control circuit) that operates in accordance with computer programs (software). The processor includes a CPU and memories such as a RAM and a ROM. The memories store, for example, program codes or commands configured to cause the processor to execute various processes. The memory, or computer readable storage medium, includes any type of storage medium that is accessible by general-purpose computers and dedicated computers.

The controller 33 is electrically connected to the air conditioning ECU 13 by the connector 27. Based on the commands from the air conditioning ECU 13, the controller 33 cyclically turns the switching elements Qu1 to Qw2 on and off. In detail, the controller 33 performs a pulse width modulation control (PWM control) on the switching elements Qu1 to Qw2 based on the commands from the air conditioning ECU 13. In more detail, the controller 33 uses a carrier signal and a commanded voltage value signal (signal for comparison) to generate a control signal. The controller 33 uses the generated control signal to perform an on-off control on the switching elements Qu1 to Qw2, thereby converting the direct-current power into alternating-current power.

The noise reducer 32 includes a common-mode choke coil 34 and an X capacitor 35. The common-mode choke coil 34 and the X capacitor 35, which serves as a smoothing capacitor, configure a low-pass filter circuit 36. The low-pass filter circuit 36 is located on the connection lines EL1 and EL2. The low-pass filter circuit 36 is located between the connector 27 and the inverter circuit 31 in the circuitry.

The common-mode choke coil 34 is located on the connection lines EL1 and EL2.

The X capacitor 35 is located on the downstream side of the common-mode choke coil 34 (i.e., located closer to the inverter circuit 31). That is, the X capacitor 35 is located between the common-mode choke coil 34 and the inverter circuit 31. The X capacitor 35 is electrically connected to the connection lines EL1 and EL2. The common-mode choke coil 34 and the X capacitor 35 configure an LC resonant circuit. That is, the low-pass filter circuit 36 of the first embodiment is an LC resonant circuit including the common-mode choke coil 34.

Two Y capacitors 37 and 38, namely, a first Y capacitor 37 and a second Y capacitor 38, are connected in series. More specifically, the driver device 24 includes a bypass line EL3 that connects a first end of the first Y capacitor 37 and a first end of the second Y capacitor 38 to each other. The bypass line EL3 is grounded to the vehicle body.

The serially-connected body of the Y capacitors 37 and 38 is provided between the common-mode choke coil 34 and the X capacitor 35 and electrically connected to the common-mode choke coil 34. A second end of the first Y capacitor 37 on the side opposite to the first end is connected to the first connection line EL1, more specifically, to a portion of the first connection line EL1 that connects a first winding 60 of the common-mode choke coil 34 and the inverter circuit 31 to each other. A second end of the second Y capacitor 38 on the side opposite to the first end is connected to the second connection line EL2, more specifically, to a portion of the second connection line EL2 that connects a second winding 61 of the common-mode choke coil 34 and the inverter circuit 31 to each other.

The on-vehicle devices of the vehicle include, for example, a power control unit 39 (PCU) provided separately from the driver device 24. The PCU 39 uses the direct-current power supplied from the on-vehicle power storage device 28 to drive the traveling motor installed in the vehicle. That is, in the first embodiment, the PCU 39 and the driver device 24 are connected in parallel to the on-vehicle power storage device 28, and the on-vehicle power storage device 28 is shared by the PCU 39 and the driver device 24.

The PCU 39 includes a boost converter 40 and a power supply capacitor 41. The boost converter 40 includes a boost switching element. The boost converter 40 cyclically turns the boost switching element on and off to boost the direct-current power of the on-vehicle power storage device 28. That is, the power supply capacitor 41 is connected in parallel to the on-vehicle power storage device 28. Although not illustrated, the PCU 39 includes a traveling inverter that converts the direct-current power boosted by the boost converter 40 into drive power with which the traveling motor can be driven.

In the above-described configuration, the noise generated by switching the boost switching element flows into the driver device 24 as normal-mode noise. In other words, the normal-mode noise contains a noise component corresponding to the switching frequency of the boost switching element.

The configuration of the common-mode choke coil 34 will now be described with reference to FIGS. 3A to 4C.

The common-mode choke coil 34 is configured to limit transmission of high-frequency noise generated in the PCU 39, which is located on the vehicle side, to the inverter circuit 31, which is on the compressor side. In particular, the common-mode choke coil 34 is used as an L component in the low-pass filter circuit (LC filter) 36 that eliminates normal-mode noise (differential-mode noise) by utilizing the leakage inductance as a normal inductance. That is, the common-mode choke coil 34 can be used to cope with common-mode noise and normal-mode noise (differential-mode noise). Both mode noises can be coped with by a single choke coil, not by the common-mode choke coil and the normal-mode (differential-mode) choke coil respectively.

In the drawings, a three-axis orthogonal coordinate system is defined such that the axial direction of the rotating shaft 17 in FIG. 1 is referred to as the "Z direction," and the directions orthogonal to the Z direction are referred to as the "X direction" and "Y direction."

As shown in FIGS. 3A to 3D, the common-mode choke coil 34 includes a loop-shaped core 50, the first winding 60, the second winding 61, and a metal thin film 70, which serves as a loop-shaped conductor.

The core 50 has a quadrangular cross section as shown in FIG. 3D, and entirely has a rectangular shape in the X-Y plane shown in FIG. 4A. As shown in FIGS. 3D and 4A, the core 50 has an inner space Sp1.

As shown in FIGS. 4A to 4C, the first winding 60 is wound around the core 50, and the second winding 61 is wound around the core 50. The first winding 60 and the second winding 61 are arranged to be opposed to each other with the axis of the core 50 between the first winding 60 and the second winding 61. More specifically, as shown in FIG. 4A, one long side portion of the rectangular core 50 is a first straight portion 51, and the other long side portion is a second straight portion 52. The first straight portion 51 and the second straight portion 52 are parallel to each other. That is, the core 50 includes the first straight portion 51 and the second straight portion 52 that extend straight in parallel to each other. At least part of the first winding 60 is wound around the first straight portion 51, and at least part of the second winding 61 is wound around the second straight portion 52. The winding directions of the two windings 60 and 61 are opposite to each other. Further, the first winding 60 and the second winding 61 are spaced apart from and opposed to each other.

A plastic case (not shown) is provided between the core 50 and the windings 60 and 61, and a protrusion (not shown) extends from the plastic case to contact and secure the metal thin film 70.

The metal thin film 70 shown in FIGS. 3A to 3D is made of copper foil. That is, the metal thin film 70, which serves as a loop-shaped conductor, has the shape of a thin film. The metal thin film 70 as a conductor has a tubular shape. The thickness of the metal thin film 70 is 10 μm to 100 μm. For example, the thickness of the metal thin film 70 is 35 μm. The metal thin film 70 is thinned in order to increase the resistance when current (induced current) flows to convert the current into heat. However, when the metal thin film 70 is thinned, it is difficult to maintain the metal thin film 70 in strength and shape.

As shown in FIGS. 3C and 3D, the metal thin film 70 is loop-shaped, more specifically, band-shaped and endless. The metal thin film 70 covers the core 50 while extending over the first winding 60 and the second winding 61. More specifically, the metal thin film 70 is formed so as to cover the entire first winding 60, the entire second winding 61, and part of the inner space Sp1 of the core 50 (refer to FIGS. 3D and 4A). In a broader sense, the metal thin film 70 is formed so as to cover at least part of each of the first winding 60, the second winding 61, and the inner space Sp1 of the core 50 (refer to FIGS. 3D and 4A). The inner space Sp1 is located between the first winding 60 and the second winding 61. The metal thin film 70 includes parts that are located between the first winding 60 and the second winding 61, i.e., opposed to each other with the inner space Sp1 located in between.

The metal thin film 70 includes a plastic layer 80 formed between the inner circumferential surface of the thin film and the outer surfaces of the first winding 60 and the second winding 61.

Referring to FIGS. 3C and 3D, the plastic layer 80 ensures the insulation as well as the strength and the high rigidity of the metal thin film 70. The plastic layer 80 is made of polyimide, and maintains the metal thin film 70 in strength and shape. The thickness of the plastic layer 80 is, for example, tens of micrometers. This is because the windings 60 and 61 and the metal thin film 70 are desirably more proximate to each other, and the magnetic fields generated by the windings 60 and 61 are received by the metal thin film 70 to cause the induced current to flow in the metal thin film 70. When the metal thin film 70 is proximate to the windings 60 and 61, the induced current readily flows in the metal thin film 70.

The metal thin film 70 and the plastic layer 80 are bonded together by an adhesive (not shown). The adhesive may be a thermosetting adhesive, a thermoplastic adhesive (hot-melt adhesive), or a pressure-sensitive adhesive.

The metal thin film 70 is formed in the following manner. First, a band-shaped metal thin film that has been integrated with a plastic layer using the same method as a method for manufacturing a general flexible substrate is prepared. Then, the opposite ends of the metal thin film are welded to each other while bending the plastic layer. This forms the metal thin film 70 into the shape of a loop. Such integration with the plastic layer allows the metal thin film to be easily formed into a looped shape, thereby improving the productivity.

The core 50 includes a plurality of exposed portions 53 and 54 that is not covered with the metal thin film 70. The exposed portions 53 and 54 are exposed to the outside. The exposed portions 53 and 54 extend from the corresponding ends of the metal film 70 in the axial direction of the metal film 70. The first winding 60 and the second winding 61 are not wound about the exposed portions 53 and 54.

The operation of the first embodiment will now be described.

First, the normal mode (differential mode) will be described with reference to FIGS. 5 and 6.

Figure 5:
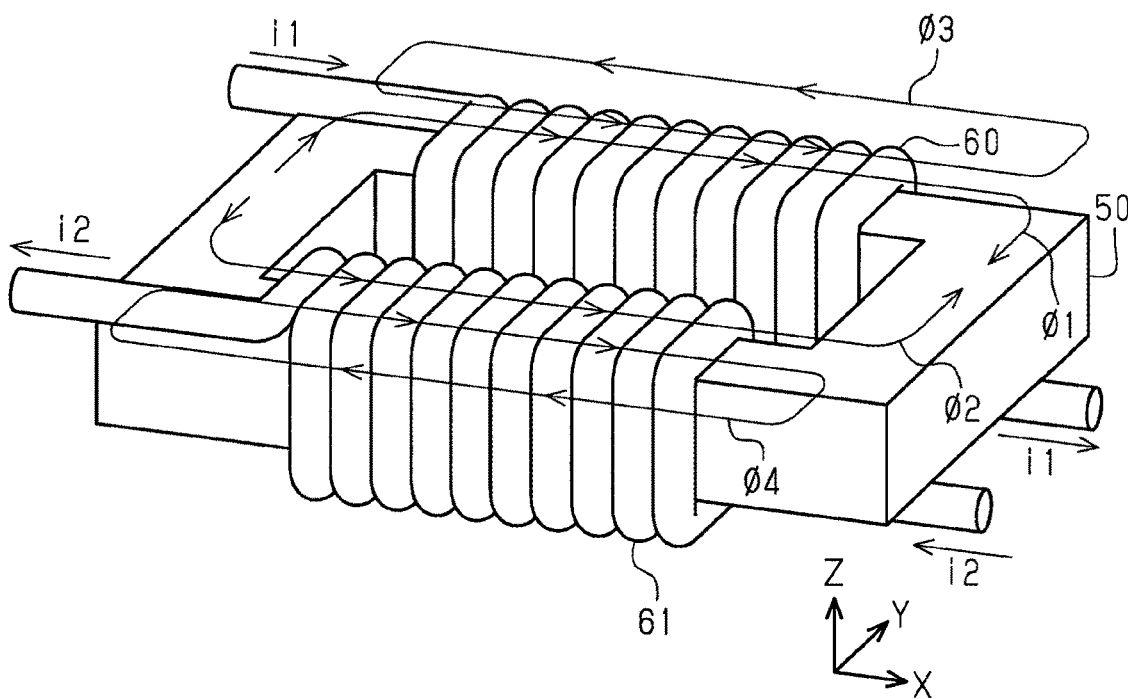
FIG. 5 is a perspective view of the core and the windings, illustrating an operation of the common-mode choke coil.
Figure 6:
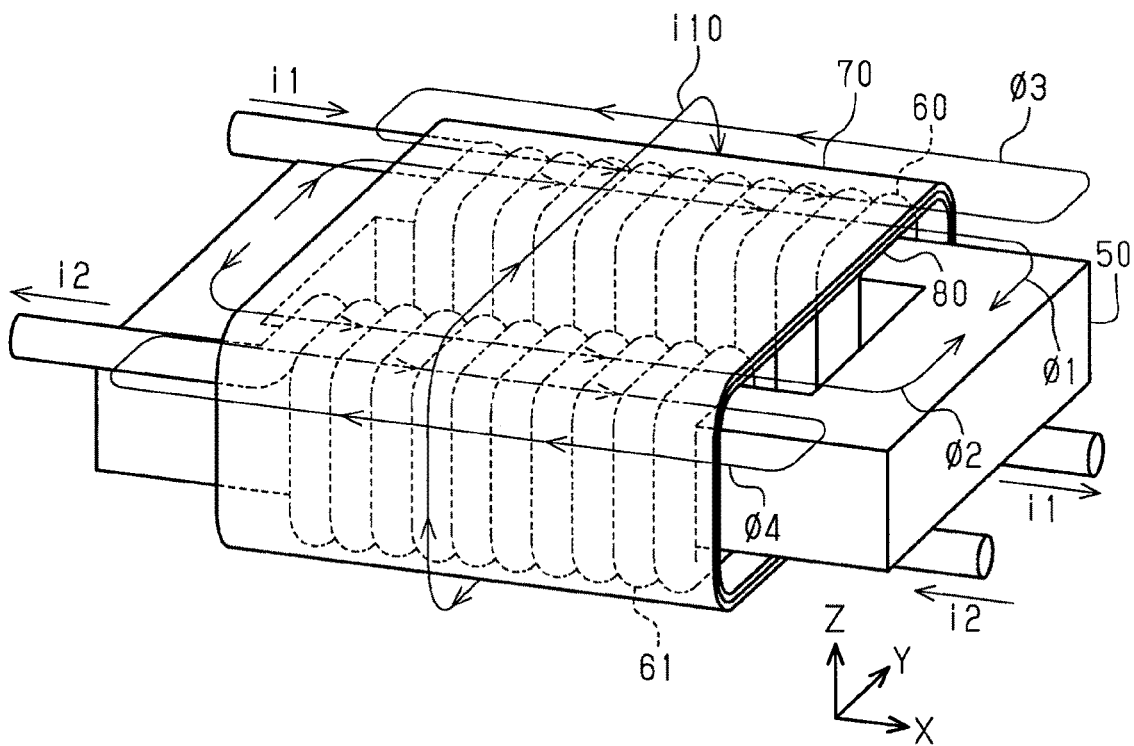
FIG. 6 is a perspective view of the common-mode choke coil, illustrating an operation of the common-mode choke coil.

As shown in FIG. 5, when the first winding 60 and the second winding 61 are energized, currents i1 and i2 flow. This generates magnetic fluxes φ1 and φ2 in the core 50 and leakage magnetic fluxes φ3 and φ4. The magnetic fluxes φ1 and φ2 are mutually opposite magnetic fluxes, and the leakage magnetic fluxes φ3 and φ4 are generated. As shown in FIG. 6, an induced current i10 flows in the circumferential direction inside the metal thin film 70 so as to generate magnetic fluxes in a direction resisting the generated leakage magnetic fluxes φ3 and φ4.

In this manner, the induced current (eddy current) i10 flows in the circumferential direction inside the metal thin film 70 so as to generate magnetic fluxes in the direction resisting the leakage magnetic fluxes generated when the first winding 60 and the second winding 61 are energized. The induced current flowing in the circumferential direction refers to the induced current flowing around the core 50.

In the common mode, when the first winding 60 and the second winding 61 are energized, currents flow in the same direction. This generates magnetic fluxes in the same direction. In this manner, when current is supplied in the common mode, magnetic fluxes are generated and almost no leakage magnetic flux is generated in the core 50. This maintains the common impedance.

Figure 7:
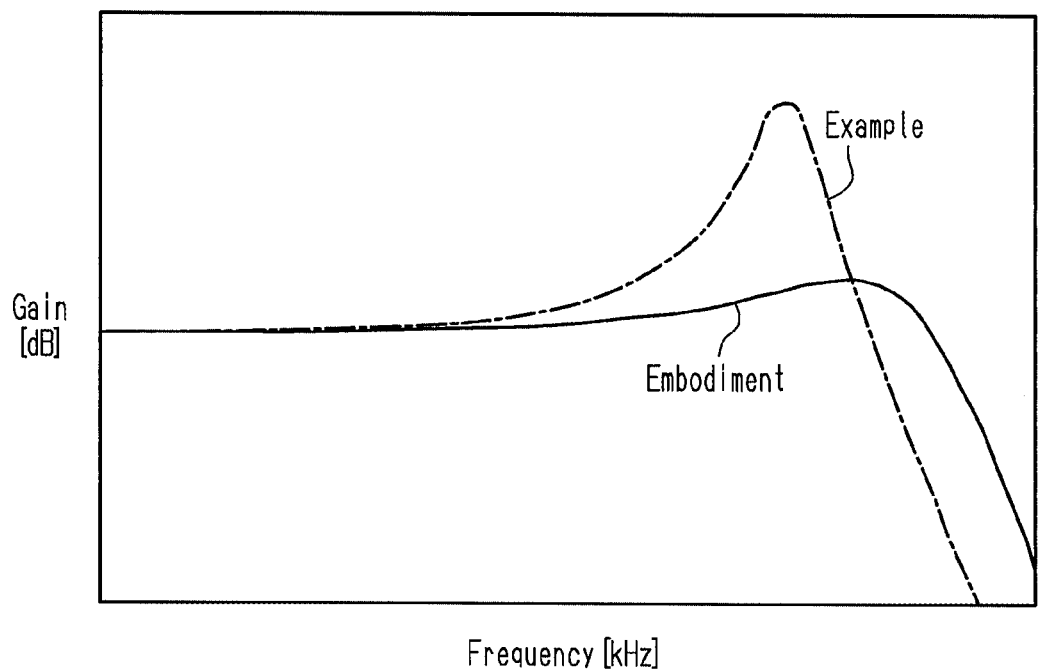
FIG. 7 is a graph showing the frequency characteristics of the gain of a low-pass filter circuit.

The frequency characteristics of the low-pass filter circuit 36 will now be described with reference to FIG. 7. FIG. 7 is a graph showing the frequency characteristics of the gain (attenuation amount) of the low-pass filter circuit 36 relative to normal-mode noise flowing into the low-pass filter circuit 36. The solid line in FIG. 7 represents the case in which the common-mode choke coil 34 includes a thin film 70 made of a conductor, and the long dashed short dashed line in FIG.

7 represents the case in which the common-mode choke coil 34 has no thin film 70 made of a conductor. Also, in FIG. 7, the frequencies are plotted logarithmically on the horizontal axis. The gain is a type of parameter indicating an amount by which normal-mode noise can be reduced.

When the common-mode choke coil 34 does not include the thin film 70 made of a conductor, the Q factor of the low-pass filter circuit 36 (more specifically, the LC resonant circuit including the common-mode choke coil 34 and the X capacitor 35) is relatively high as indicated by the long dashed short dashed line in FIG. 7. Therefore, the normal-mode noise of a frequency close to the resonant frequency of the low-pass filter circuit 36 cannot be easily reduced.

In the first embodiment, the common-mode choke coil 34 includes the thin film 70 made of a conductor at a position where eddy currents are generated by the line of magnetic force (leak magnetic fluxes φ3 and φ4) generated in the common-mode choke coil 34. The thin film 70 made of a conductor is located at a position passing through the loops of the leakage magnetic fluxes φ3 and φ4. The thin film 70 is configured such that the leakage magnetic fluxes φ3 and φ4 generate an induced current (eddy current) that generates magnetic fluxes in a direction cancelling the leakage magnetic fluxes φ3 and φ4. As a result, the thin film 70 made of a conductor lowers the Q factor of the low-pass filter circuit 36. Thus, as indicated by the solid line in FIG. 7, the Q factor of the low-pass filter circuit 36 is low. Therefore, the normal-mode noise having a frequency near the resonant frequency of the low-pass filter circuit 36 is also reduced by the low-pass filter circuit 36.

As described above, the employment of a metal shielding structure with the band-shaped, endless metal thin film 70 in the common-mode choke coil allows for the use of the low-pass filter circuit as the common-mode choke coil, thereby reducing the common mode noise. Also, the leakage magnetic fluxes generated relative to normal-mode current (differential-mode current) are fully utilized to obtain suitable filtering characteristics that involve the reduction of normal-mode noise (differential-mode noise). That is, the use of the band-shaped, endless metal thin film 70 generates magnetic fluxes resisting the leakage magnetic fluxes generated when normal-mode current (differential-mode current) is supplied, and electromagnetic induction is performed to cause the current to flow in the metal thin film 70 and to be consumed as heat. Since the metal thin film 70 acts as a magnetic resistance, a damping effect is obtained and the resonance peak generated by the low-pass filter circuit is reduced (refer to FIG. 7). Further, when current is supplied in the common mode, magnetic fluxes are generated but almost no leakage magnetic flux is generated in the core. This maintains the common impedance. Furthermore, since the plastic layer 80 (polyimide layer) is provided on the inner side of the metal thin film (metal foil) 70, the shape of the metal thin film 70 is maintained and the insulation from the windings 60 and 61 is ensured.

The above-described embodiment has the following advantages.

(1) The on-vehicle motor-driven compressor 11 includes the inverter device 30, which drives the electric motor 19. The inverter device 30 includes the inverter circuit 31 and the noise reducer 32. The noise reducer 32 includes the common-mode choke coil 34 and the X capacitor 35, which serves as a smoothing capacitor. The common-mode choke coil 34 and the X capacitor 35 configure the low-pass filter circuit 36. The common-mode choke coil 34 includes the loop-shaped core 50, the first winding 60, the second winding 61, and the metal thin film 70. The first winding 60 is wound around the core 50. The second winding 61 is wound around the core 50, and opposed to and spaced apart from the first winding 60. The metal thin film 70 serves as a loop-shaped conductor that covers the core 50 while extending over the first winding 60 and the second winding 61. The core 50 includes the exposed portions 53 and 54, which are not covered with the metal thin film 70. The metal thin film 70 includes the parts located between the first winding 60 and the second winding 61 and opposed to each other.

Having the exposed portions 53 and 54, which are not covered with the metal thin film 70, the core 50 is excellent in the heat dissipation properties. Also, the metal thin film 70 has a loop shape covering the core 50 while extending over the first winding 60 and the second winding 61. Thus, when a normal-mode current flows through the core 50, an induced current is supplied into the metal thin film 70, allowing the current to be readily converted into thermal energy. Accordingly, the core 50 has a damping effect. Since the leakage magnetic fluxes generated from the first winding 60 and the second winding 61 form a loop shape connected to the metal thin film 70 (conductor) through the exposed portions 53 and 54 of the core 50, an induced current readily flows to the metal thin film 70 (conductor). As a result, this configuration dispenses with the normal mode choke coil.

(2) The conductor (70) has the shape of a thin film and includes the plastic layer 80, which is located between the inner circumferential surface of the thin film and the outer surfaces of the first winding 60 and the second winding 61. Thus, since the plastic layer 80 is arranged between the inner circumferential surface of the thin film of the thin film-shaped conductor (metal thin film 70) and the outer surfaces of the first winding 60 and the second winding 61, it is possible to maintain the strength, increase the rigidity, and ensure the insulation even when a conductor is thinned to increase the resistance component in order to form a compact filter circuit excellent in the heat dissipation properties and damping effect.

(3) The core 50 includes the first straight portion 51 and the second straight portion 52, which extend straight in parallel to each other. At least part of the first winding 60 is wound around the first straight portion 51, and at least part of the second winding 61 is wound around the second straight portion 52. Thus, the metal thin film 70 can be easily arranged. This is of practical use.

Modifications will now be described.

The metal thin film 70 does not have to be made of copper foil. Instead, the metal thin film 70 may be made of, for example, aluminum foil, brass foil, or foil of stainless steel. These non-magnetic metals do not generate further magnetic fluxes as the induced current flows through the non-magnetic metals and are thus easy to handle. Further, the material is not limited to a non-magnetic metal such as copper but may be a magnetic metal such as iron.

The conductor covering the core 50 is not limited to a thin film as long as it is loop-shaped. The conductor may be, for example, a relatively thick plate.

The plastic layer 80 does not have to be made of polyimide. Instead, the plastic layer 80 may be made of, for example, polyester, PET, or PEN.

The filtering characteristics of the low-pass filter circuit 36 can be easily adjusted by changing the width of the metal thin film 70.

Second Embodiment

A second embodiment will now be described, focusing on the difference from the first embodiment.

Instead of FIGS. 3A to 3D, the second embodiment has the structure shown in FIGS. 8A to 8C.

The metal thin film 70, which serves as a thin film-shaped conductor, has a structure in which the opposite ends of the metal thin film 70 are overlapped with each other while curving a belt-shaped thin film. The metal thin film 70 includes a loop-shaped portion 70a and tabs 71 and 72. The loop-shaped portion 70a is curved while covering the core 50. The tabs 71 and 72 protrude outward from the loop-shaped portion 70a. The tabs 71 and 72 are the opposite ends of the belt-shaped thin film before being overlapped with each other. The tabs 71 and 72 are soldered to each other. That is, the tabs 71 and 72 are the opposite ends welded to each other with solder 100, which is a metal material having a lower melting point than the metal thin film 70 (copper foil). Further, a Ni plating layer 73 serving as a metal plating layer is formed on the interface of the tab 71 with the solder 100. In the same manner, a Ni plating layer 74 serving as a metal plating layer is formed on the interface of the tab 72 with the solder 100. The Ni plating layer 73 and 74 are respectively formed on the entire opposing surfaces of the tabs 71 and 72. The solder 100 is also formed on the entire opposing surfaces of the tabs 71 and 72.

The loop-shaped portion 70a and the tabs 71 and 72 of the metal thin film 70 are thermally coupled to the bottom wall 15a of the housing 14 using thermal grease 110. In addition, three bolts B are extended through the tabs 71 and 72 and fastened to the bottom wall 15a of the housing 14. This secures the tabs 71 and 72 to the bottom wall 15a of the housing 14.

As shown by the imaginary line in FIG. 8B, an insulating spacer 200 is located when the circuit board 29 is arranged proximate to the common-mode choke coil 34.

The metal thin film 70 is manufactured in the following manner.

First, as shown in FIGS. 9A to 9C, the belt-shaped metal thin film 70 (copper foil) is prepared. The plastic layer 80 is formed on one surface of the metal thin film 70. The metal thin film 70 may be made of aluminum. Further, on the surface of the belt-shaped metal thin film 70 on which the plastic layer 80 is formed, the Ni plating layers 73 and 74 are respectively formed at portions of the opposite ends of the metal thin film 70 that serve as the tabs 71 and 72.

Then, as shown in FIGS. 10A to 10C, the two ends of the belt-shaped metal thin film 70 are connected to have a loop shape such that the surface of the belt-shaped metal thin film 70 on which the plastic layer 80 and the Ni plating layers 73 and 74 are formed is located on the inner side. The tabs 71 and 72 protrude outward from the loop-shaped portion 70a. In addition, unmelted solder 100 is arranged between the Ni plating layer 73 and the Ni plating layer 74 of the tabs 71 and 72.

In this state, the tabs 71 and 72 that hold the unmelted solder 100 in between is held by a heater. The heater heats and melts the solder 100 so that the tabs 71 and 72 are welded to each other with the solder 100.

The operation of the second embodiment will now be described.

Current is supplied into the belt-shaped, endless metal thin film 70 to generate magnetic fluxes in a direction resisting leakage magnetic fluxes. This consumes power, thereby generating heat.

Since the metal thin film 70 is thermally coupled to the bottom wall 15a, heat Q (refer to FIG. 8C) generated in the common-mode choke coil 34 is released to the bottom wall 15a. Thus, the heat generated in the metal thin film 70 is released through the thermal grease 110 to improve the heat dissipation properties.

The operation of the second embodiment will now be described in detail.

Regarding the method and position of joining the metal thin film 70, in the common-mode choke coil 34, the metal thin film 70 surrounds the first winding 60 and the second winding 61 and needs a loop shape having electrical connection. Further, since the thickness affects the damping characteristics, a smaller thickness increases the damping effect.

When the loop-shaped conductor is manufactured through stamping (drawing), the loop shape can be easily formed. However, stamping with a thin plate is not so practical. A larger thickness will not increase the damping effect.

To cope with this problem, a belt-shaped (ribbon-shaped) thin plate is prepared. When the plate is formed into a loop shape and then the opposite ends of the thin plate are joined to each other, the damping effect will be high because the plate is thin. Nevertheless, in the case of welding, the quality of joining at the joined portion cannot be ascertained. This will make quality assurance difficult. Further, in the case of soldering, when the temperature of the loop-shaped conductor serving as a shielding portion is high (for example, 250° C.), the solder may be melted. Thus, the temperature of the conductor needs to be, for example, less than or equal to 250° C.

In the present embodiment, the opposite ends of the metal thin film 70 are tab-shaped. The tabs 71 and 72 are soldered to each other and fastened to the bottom wall 15a of the housing 14. This prevents the temperature of the tabs 71 and 72, which are soldered parts, from becoming high.

The second embodiment has the advantages described below.

(4) The metal thin film 70 has the structure in which the belt-shaped thin film is curved and the opposite ends are overlapped with each other. The metal thin film 70 includes the loop-shaped portion 70a, which is curved while covering the core 50, and the tabs 71 and 72, which protrude outward from the loop-shaped portion 70a. The tabs 71 and 72 are the opposite ends of welded to each other with the solder 100, which is a metal material having a lower melting point than the metal thin film 70. Thus, the loop-shaped conductor covering the core can be easily manufactured.

(5) The Ni plating layers 73 and 74, which serve as metal plating layers, are formed on the interface of the tabs 71 and 72 with the solder 100. This ensures that soldering is performed.

(6) The loop-shaped portion 70a of the metal thin film 70 is thermally coupled to the bottom wall 15a of the housing 14. The tabs 71 and 72 are secured to the bottom wall 15a of the housing 14. Thus, securing the tabs 71 and 72 to the heat dissipation surface allows for excellent thermal resistance and vibration resistance and improves the reliability of the soldered part.

Modifications will now be described.

Instead of the structure illustrated in FIGS. 8A to 9C, the tabs 71 and 72 may be in contact with the bottom wall 15a of the housing 14, which serves as a heat dissipation surface, without using the bolts as shown in FIGS. 11A to 11C.

Instead of the structure illustrated in FIGS. 11A to 11C, the tabs 71 and 72 may be spaced apart from the bottom wall 15a of the housing 14, which serves as a heat dissipation surface, as shown in FIGS. 12A to 12C. In this case, the joined portion is arranged in the vicinity of the heat dissipating surface (for example, a height less than or equal to the half of the height H1 of the common-mode choke coil 34 in FIG. 12C). As a result, the temperature at the joined portion becomes lower toward the heat dissipation surface, thereby having a small influence on the soldered portion.

Instead of the structure illustrated in FIGS. 11A to 11C, as shown in FIGS. 13A to 13C, the tabs 71 and 72 may be bent along the outer circumferential surface of the loop-shaped portion 70a of the metal thin film 70 in a direction the tabs 71 and 72 are located away from the bottom wall 15a of the housing 14, which serves as a heat dissipation surface. Additionally, the bent tabs 71 and 72 are bonded and secured to the loop-shaped portion 70a. Thus, as opposed to when the tabs 71 and 72 project out of the loop-shaped portion 70a of the metal thin film 70 to a large extent to increase the size of the metal thin film 70 as illustrated in FIGS. 8A to 8C, the occupied areas of the tabs 71 and 72 are reduced. This achieves space saving and allows other components to be arranged on the space-saving part. In this manner, when the joined portion is bent, increases in the size of the joined portion are reduced.

Coupling the common-mode choke coil 34 to the circuit board 29 and bending the tabs 71 and 72 may be performed in either order. Additionally, it is preferred that the bent tabs 71 and 72 do not project out of the loop-shaped portion 70a in the Z-direction and be not located away from the loop-shaped portion 70a as much as possible in FIG. 13C.

Instead of the structure illustrated in FIGS. 11A to 11C, as shown in FIGS. 14A to 14C, the tabs 71 and 72 may be bent along the outer circumferential surface of the loop-shaped portion 70a of the metal thin film 70 in a direction in which the tabs 71 and 72 are located toward the bottom wall 15a of the housing 14, which serves as a heat dissipation surface.

The tabs 71 and 72 may be joined to each other through brazing instead of soldering. That is, the tabs 71 and 72 do not have to be welded with the solder 100 serving as a metal material that has a lower melting point than a conductor (copper), and the tabs 71 and 72 may be joined to each other through brazing instead of using the solder 100.

Therefore, the present examples and embodiments are to be considered as illustrative and not restrictive and the disclosure is not to be limited to the examples and embodiments given herein.

The invention claimed is:

1. An on-vehicle motor-driven compressor comprising:
a compression unit configured to compress fluid;
an electric motor configured to drive the compression unit; and
an inverter device configured to drive the electric motor, wherein
the inverter device includes:
an inverter circuit configured to convert direct-current power into alternating-current power, and
a noise reducer arranged on an input side of the inverter circuit, wherein the noise reducer is configured to reduce common-mode noise and normal-mode noise contained in the direct-current power before being input to the inverter circuit,
the noise reducer includes:
a common-mode choke coil, and
a smoothing capacitor, wherein the common-mode choke coil and the smoothing capacitor configure a low-pass filter circuit,
the common-mode choke coil includes:
a loop-shaped core,
a first winding wound around the core,
a second winding wound around the core, wherein the second winding is spaced apart from and opposed to the first winding, and
a loop-shaped conductor that covers the core while extending over the first winding and the second winding,
the core includes an exposed portion that is not covered with the conductor, and
a hole is defined inside of the core and the hole has two openings at both ends thereof, and the conductor covers the two openings of the hole.

2. The on-vehicle motor-driven compressor according to claim 1, wherein
the conductor is made of a thin film, and
the conductor includes a plastic layer arranged between an inner circumferential surface of the thin film and outer surfaces of the first winding and the second winding.

3. The on-vehicle motor-driven compressor according to claim 1, wherein
the core includes a first straight portion and a second straight portion that extend straight in parallel to each other,
at least part of the first winding is wound around the first straight portion, and
at least part of the second winding is wound around the second straight portion.

4. The on-vehicle motor-driven compressor according to claim 2, wherein
the conductor is made of a curved thin film having a belt shape,
the conductor includes two ends that are overlapped with each other,
the conductor includes a loop-shaped portion that is curved while covering the core and a tab that protrudes outward from the loop-shaped portion, and
the tab is configured by welding the two ends to each other with a metal material having a lower melting point than the conductor.

5. The on-vehicle motor-driven compressor according to claim 4, wherein a metal plating layer is formed on an interface of the tab with the metal material, which has a low melting point.

6. The on-vehicle motor-driven compressor according to claim 4, wherein
the loop-shaped portion is thermally coupled to the housing, and
the tab is secured to the housing.

7. The on-vehicle motor-driven compressor according to claim 4, wherein the tab is bent along an outer circumferential surface of the loop-shaped portion.

8. The on-vehicle motor-driven compressor according to claim 1, wherein
the conductor surrounds the first winding and the second winding, and
the conductor covers at least a portion of the first winding that is located on an outer periphery of the core and at least a portion of the second winding that is located on the outer periphery of the core.

9. The on-vehicle motor-driven compressor according to claim 3, wherein
the conductor covers at least a part of the first straight portion and the second straight portion.

* * * * *